United States Patent
Chang

(10) Patent No.: US 6,728,938 B2
(45) Date of Patent: Apr. 27, 2004

(54) KNOWLEDGE-BASED INTELLIGENT FULL SCAN DUMP PROCESSING METHODOLOGY

(75) Inventor: Si-En Chang, Cupertino, CA (US)

(73) Assignee: Sun Microsystems, Inc., Palo Alto, CA (US)

(*) Notice: Subject to any disclaimer, the term of this patent is extended or adjusted under 35 U.S.C. 154(b) by 103 days.

(21) Appl. No.: 10/132,916

(22) Filed: Apr. 26, 2002

(65) Prior Publication Data

US 2003/0204825 A1 Oct. 30, 2003

(51) Int. Cl.⁷ ................................................ G06F 17/50
(52) U.S. Cl. .................. 716/4; 716/5; 714/30; 714/724
(58) Field of Search ................... 716/1–18; 714/30, 714/724; 700/49, 103, 104, 110

(56) References Cited

U.S. PATENT DOCUMENTS

| | | | | |
|---|---|---|---|---|
| 5,513,118 A | * | 4/1996 | Dey et al. | 716/18 |
| 5,550,841 A | * | 8/1996 | O'Brien | 714/724 |
| 5,892,779 A | | 4/1999 | Ohyama et al. | 371/27.1 |
| 5,903,577 A | | 5/1999 | Teene | 371/22.1 |
| 6,043,672 A | | 3/2000 | Sugasawara | 324/765 |
| 6,105,156 A | | 8/2000 | Yamauchi | 714/738 |
| 6,122,756 A | * | 9/2000 | Baxter et al. | 714/30 |
| 6,173,426 B1 | | 1/2001 | Sanada | 714/724 |
| 6,178,244 B1 | | 1/2001 | Takeda et al. | 380/277 |

* cited by examiner

Primary Examiner—Vuthe Siek
(74) Attorney, Agent, or Firm—Hamilton & Terrile, LLP; Stephen A. Terrile

(57) ABSTRACT

A systematic methodology to analyze a full scan dump is presented. The methodology is knowledge-based, i.e., the methodology intelligently processes a full scan dump using knowledge of the system from which the full scan is obtained.

12 Claims, 4 Drawing Sheets

KNOWLEDGE-BASED INTELLIGENT FULL SCAN DUMP PROCESSING METHODOLOGY

BACKGROUND OF THE INVENTION

1. Field of the Invention

The present invention relates to failure analysis of integrated circuits and more particularly to knowledge-based failure analysis of integrated circuits.

2. Description of the Related Art

It is known to test and fault isolate a semiconductor integrated circuits (IC's) using a visual scan of the potentially faulty locations on the chip. Probes are utilized after a visual scan has been performed on the chip using a microscope. Such a visual scan over large portions of a 75,000 to over 100,000 gate chip is exceptionally time consuming and potentially error prone.

If an error is detected in a circuit, it is often difficult to isolate the exact location of the malfunctioning element. Testing procedures that have been employed to test ICs include transmitting data through the circuit and reading data output from the circuit.

Improving the testing time required for integrated circuits requires isolation of the faults on a chip to as small an area as possible. The cause of the fault may then be quickly determined if a small enough area can be isolated. Ideally, a single location should be isolated so that the cause of the failure can be visually determined with little time or effort.

Accordingly, it is know to perform analysis of a system by providing a set of inputs and then reading the state of every flip-flop within the system, this analysis is commonly referred to as full scan dump processing. The advent of VLSI/ULSI technology causes the number of flip-flops in an integrated circuit to double every three years. Therefore, the amount of VLSI/ULSI full scan data is doubled every three years. Based on current technology, there are about 80,000 flops in a typical high performance microprocessor such a an UltraSparc III processor. This number will likely become 160,000 within three years. The more than 80,000 bits of information is a huge amount of data for designers to utilize and analyze.

It is difficult for human beings to process such a large amount of raw data. Traditionally, each bit of the raw data is annotated with the associated flop-flop name. The size of an annotated full scan dump is usually 8–10 times larger than that of the raw data. For the UltraSparc III processor, the size of a full scan dump exceeds 650 k-byte. To diagnose a failure with such a large size full scan dump is a difficult and error prone task.

SUMMARY OF THE INVENTION

In accordance with the present invention, a systematic methodology to analyze a full scan dump is presented. The methodology is knowledge-based, i.e., the methodology intelligently processes a full scan dump using knowledge of the system from which the full scan is obtained.

More specifically, in a preferred embodiment, the present invention relates to a method for processing a scan dump of an integrated circuit which includes a scan to the integrated circuit that provides a scan dump. The scan dump is processed to determine whether any errors are present. If an error is present, information is provided to generate another scan of the integrated circuit. Information from intelligently checking the scan dump is extracted based upon knowledge of the integrated circuit.

The present invention relates to a scan dump analysis system for analyzing a scan dump of an integrated circuit which includes: means for providing a scan to the integrated circuit, the integrated circuit providing a scan dump; means for extracting information from the scan dump based upon knowledge of the integrated circuit; means for processing the scan dump to determine whether any errors are present in the scan dump; means for intelligently checking the scan dump based upon knowledge of the integrated circuit; and, means for providing information to generate another scan of the integrated circuit, if an error is determined to be present.

The present invention relates to a scan dump analysis system for analyzing a scan dump of an integrated circuit which includes a knowledge-based extractor portion and an intelligent checker portion. The knowledge based extractor portion extracts information from the scan dump based upon knowledge of the integrated circuit. The intelligent checker portion processes the scan dump to determine whether any errors are present and checks the scan dump, based upon knowledge of the integrated circuit, to determine what part of the integrated circuit caused the error to be present. The intelligent checker provides information to generate another scan of the integrated circuit if an error is determined to be present.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

The present invention provides a systematic methodology and system to analyze a full scan dump. The methodology is knowledge-based, i.e., the methodology intelligently processes a full scan dump using knowledge of the system from which the full scan is obtained.

Figure 1:
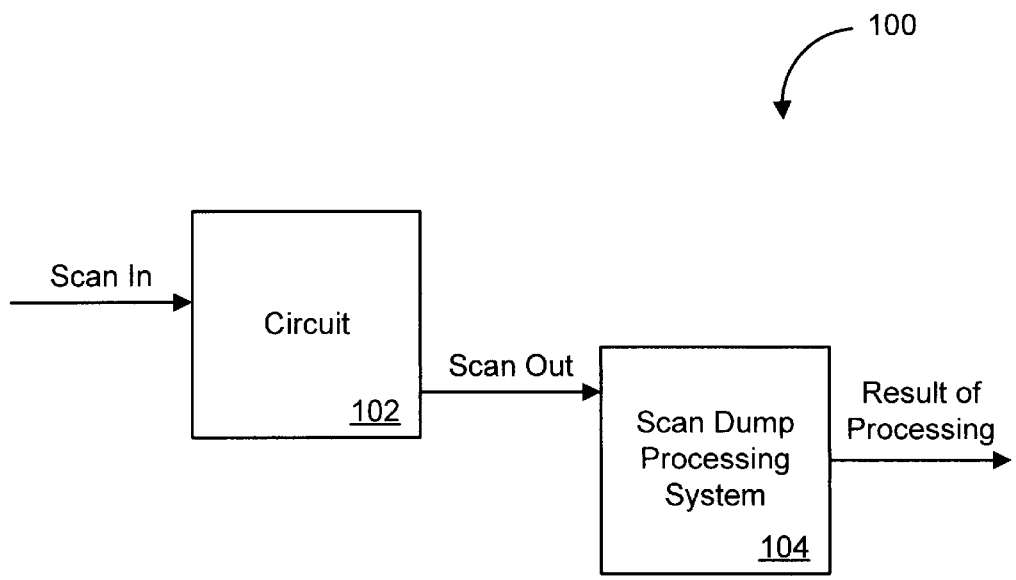
FIG. 1 shows a example of a system which uses knowledge-based intelligent full scan dump processing system in accordance with the present invention

Referring to FIG. 1, integrated circuit 102, such as an UltraSparcIII processor, is coupled to scan dump analysis system 104. Integrated circuit 102 is provided with a known set of inputs. These inputs may then be used to generate a full scan dump. The full scan dump is provided to scan dump analysis system 104. Scan dump analysis system 104 extracts important information from the scan dump and then analyzes this information to identify whether each sub-block of integrated circuit 102 is operating properly. Scan dump analysis system 104 then provides an output indicating the results of the analysis.

Figure 2:
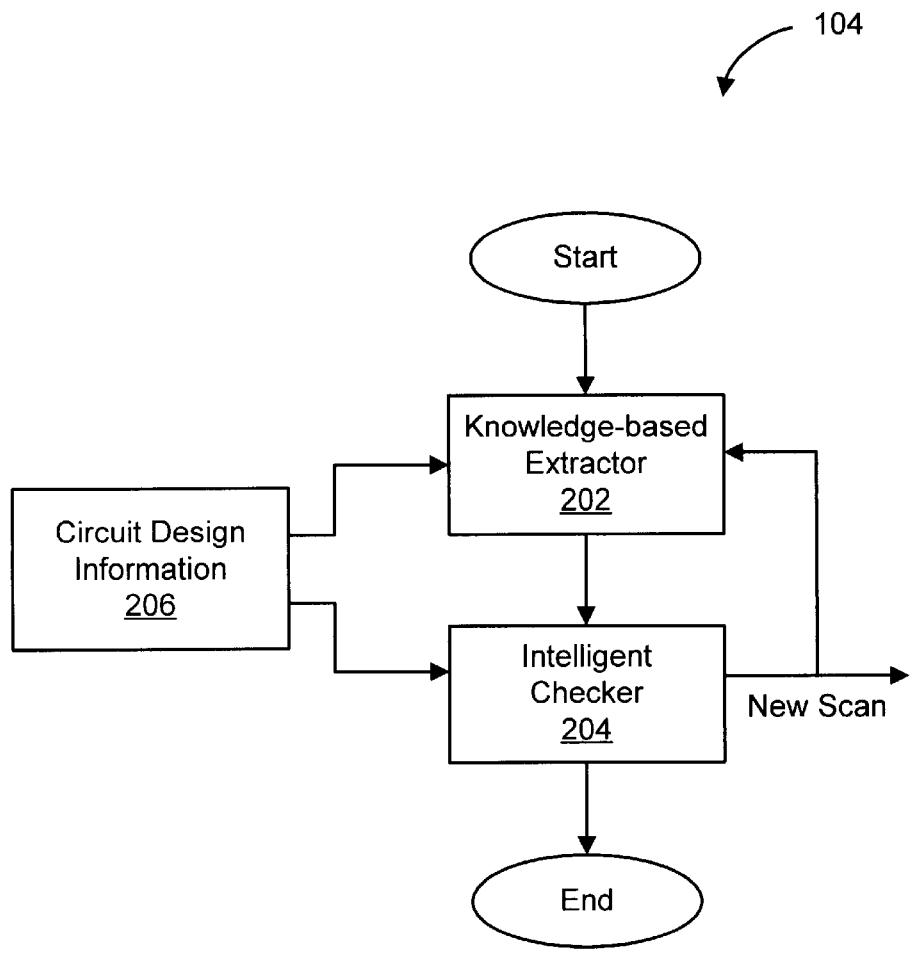
FIG. 2 shows the knowledge-based intelligent full scan dump processing system of FIG. 1.

Referring to FIG. 2, the scan dump analysis system 104 includes two portions, a knowledge-based extractor portion 202 and an intelligent checker portion 204. The knowledge-based extractor portion 202 takes a full scan as an input and extracts important information into sub-blocks based on knowledge of the system from which the full scan is obtained. Therefore, the extracted information includes substantially all necessary data to be processed by the intelligent checker portion 204. The intelligent checker portion 204 processes the data extracted from the knowledge-based extractor portion 202. The intelligent checker portion 204 intelligently identifies whether each sub-block is operating in normal mode or not. The intelligent checker portion 204 then reports the status of each sub-block.

Figure 3:
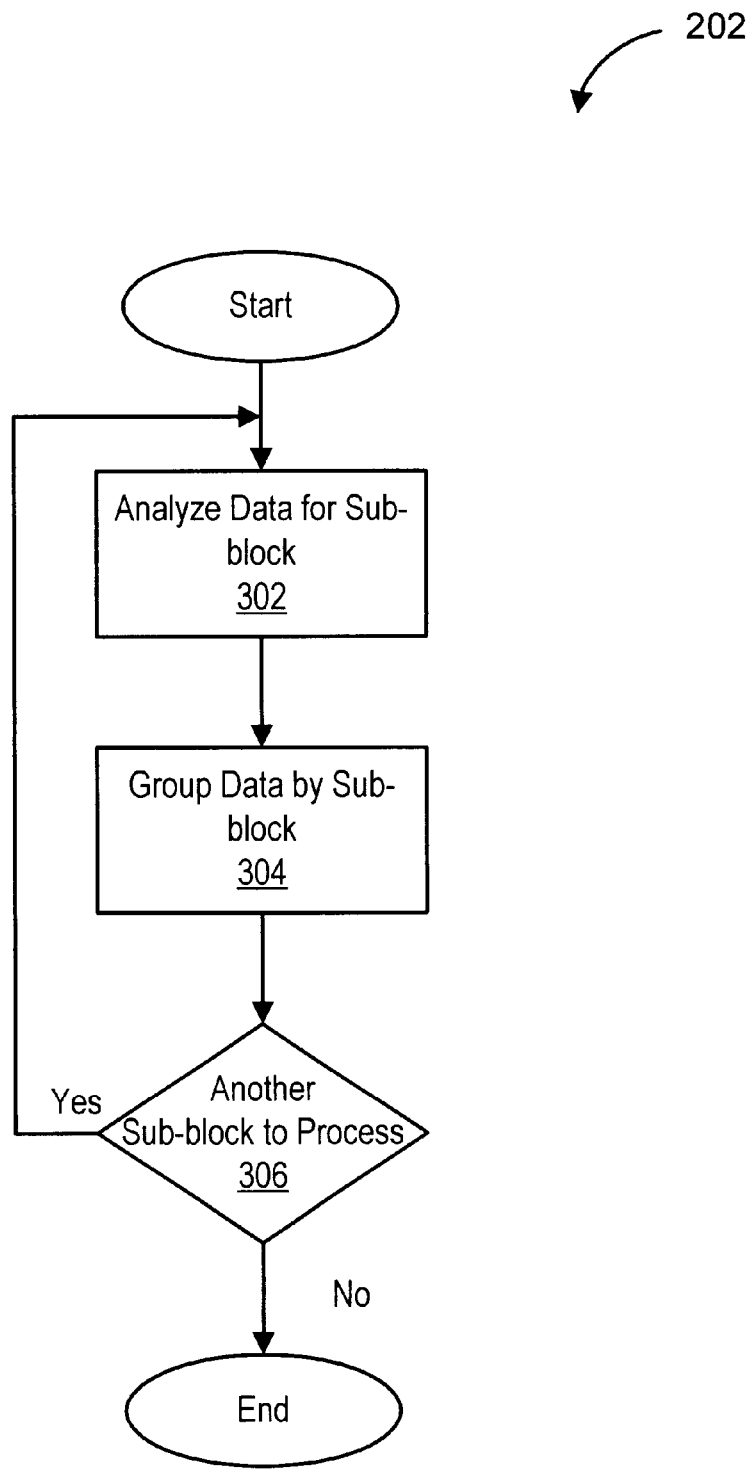
FIG. 3 shows a flow chart of the knowledge-based extractor portion of the intelligent full scan dump processing system of FIG. 2.

Referring to FIG. 3, a flow chart of the operation of the knowledge-based extractor portion 202 is shown. More specifically, the knowledge-based extractor portion 202 starts by analyzing data for a sub-block at analyze step 302. After the data is analyzed by sub-block, then the knowledge-based extractor groups the data by sub-block at group step 304 based upon knowledge of the system for which the scan dump is being processed. After the data is grouped by sub-block, then the scan dump in analyzed at step 306 to determine whether to process another sub-block. If there are any other sub-blocks to process, then control returns to step 302 to analyze the data for another sub-block. If there are not any other sub-blocks, then the processing of the knowledge-based extractor completes.

Figure 4:
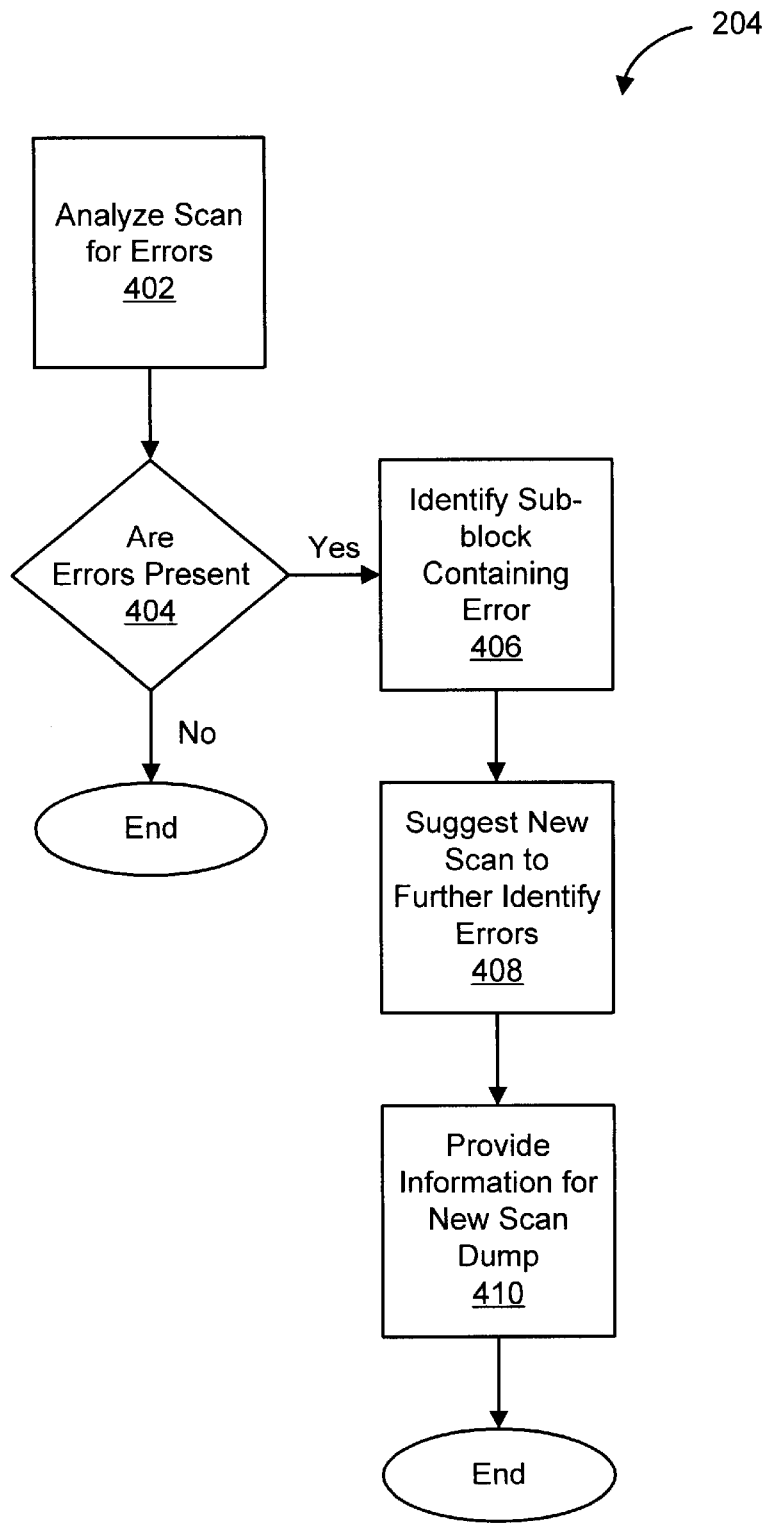
FIG. 4 shows a flow chart of the intelligent checker portion of the intelligent full scan dump processing system of FIG. 2.

Referring to FIG. 4, a flow chart of the operation of the intelligent checker portion 204 of the scan dump analysis system 104 is shown. More specifically, the intelligent checker portion 204 starts operation by analyzing the processed scan dump for errors at step 402. Next, the intelligent checker portion 204 determines whether any errors are present at step 404. If there are not errors present, then processing of the scan dump completes. If there are errors present, then the intelligent checker portion 204 identifies sub-blocks containing errors at step 406. After the sub-blocks containing the errors are identified, then the intelligent checker suggests a new scan for the scan dump analysis system 104 to analyze to further identify the source of the errors at step 408. The new scan that is suggested is based upon the knowledge of the system for which the scan dump is being analyzed. After the new scan is suggested, then the information for the new scan is provided to circuit 102 at step 410. Once the new scan information is provided, the operation of the intelligent checker portion 204 completes.

Other Embodiments

Other embodiments are within the following claims.

What is claimed is:

1. A method for processing a scan dump of an integrated circuit, comprising:
   providing a scan to the integrated circuit, the integrated circuit providing a scan dump;
   processing the scan dump to determine whether any errors are present in the scan dump;
   if an error is determined to be present, providing information to generate another scan of the integrated circuit;
   extracting information from the scan dump based upon knowledge of the integrated circuit, the extracting including
   receiving circuit design information;
   analyzing the scan dump in light of the circuit design information; and
   providing the scan dump in a predetermined format; and
   intelligently checking the scan dump based upon knowledge of the integrated circuit.

2. The method of claim 1, wherein the predetermined format includes grouping the scan dump into sub-blocks.

3. The method of claim 1, wherein the intelligently checking includes:
   comparing the scan dump with an expected result, the expected result being based on the scan to the integrated circuit; and
   determining whether an error occurred.

4. The method of claim 3, wherein the intelligent checking further comprises:
   providing information about the error.

5. A scan dump analysis system for analyzing a scan dump of an integrated circuit comprising:
   means for providing a scan to the integrated circuit, the integrated circuit providing a scan dump;
   means for extracting information from the scan dump based upon knowledge of the integrated circuit, the means for extracting including
   means for receiving circuit design information;
   means for analyzing the scan dump in light of the circuit design information; and
   means for providing the scan dump in a predetermined format;
   means for processing the scan dump to determine whether any errors are present in the scan dump;
   means for intelligently checking the scan dump based upon knowledge of the integrated circuit; and,
   means for providing information to generate another scan of the integrated circuit, if an error is determined to be present.

6. The scan dump analysis system of claim 5, wherein the predetermined formats includes grouping the scan dump into sub-blocks.

7. The scan dump analysis system of claim 5, wherein the means for intelligently checking includes:
   means for comparing the scan dump with an expected result, the expected result being based on the scan to the integrated circuit; and
   means for determining whether an error occurred.

8. The scan dump analysis system of claim 7, wherein the means for intelligent checking further comprises:
   means for providing information about the error.

9. A scan dump analysis system for analyzing a scan dump of an integrated circuit comprising:
   a knowledge-based extractor portion, the knowledge based extractor portion extracting information from the scan dump based upon knowledge of the integrated circuit;
   an intelligent checker portion, the intelligent checker portion processing the scan dump to determine whether any errors are present in the scan dump, checking the scan dump based upon knowledge of the integrated circuit to determine what part of the integrated circuit caused the error to be present, and, providing information to generate another scan of the integrated circuit if an error is determined to be present; wherein
   knowledge-based extractor receives circuit design information analyzes the scan dump in light of the circuit design information, and provides the scan dump in a predetermined format.

10. The scan dump analysis system of claim 9, wherein the predetermined formats includes grouping the scan dump into sub-blocks.

11. The scan dump analysis system of claim 9, wherein the intelligently checker portion compares the scan dump with an expected result, the expected result being based on the scan to the integrated circuit, and determines whether an error occurred.

12. The scan dump analysis system of claim 11, wherein the intelligent checker provides information about the error.

* * * * *